United States Patent [19]

Hammerschmidt et al.

[11] Patent Number: 5,427,985
[45] Date of Patent: Jun. 27, 1995

[54] AMORPHOUS, HYDROGENATED CARBON AS AN INSULATOR IN DEVICE FABRICATION

[75] Inventors: Albert Hammerschmidt, Erlangen; Thomas Mandel, Nuremberg, both of Germany

[73] Assignee: Siemens Aktiengesellschaft, Munich, Germany

[21] Appl. No.: 209,027

[22] Filed: Mar. 9, 1994

[30] Foreign Application Priority Data

Mar. 9, 1993 [DE] Germany .................. 43 07 425.1

[51] Int. Cl.⁶ ........................................ H01L 21/8234
[52] U.S. Cl. .................................... 437/243; 437/941
[58] Field of Search ............. 437/243, 101, 941, 962, 437/937; 257/410, 289

[56] References Cited

U.S. PATENT DOCUMENTS 5,055,421 10/1991 Birkle et al. .................. 437/101
5,196,907  3/1993 Birkle et al. .................. 257/289

OTHER PUBLICATIONS

Wolf, Silicon Processing for the VLSI Era vol. 1, Process Technology, 220–223, copyright 86 Lattice Press.
Chou et al., Japanese Journal of Applied Physics vol. 32, pp. L539–L542 (Date Unknown).
Chou et al., Journal of Applied Physics vol. 75, No. 9, 15 Feb. 1994 pp. 2257–2263.
Frauenheim, T. et al., "Electrical Transport and Electronic Properties of Amorphous Carbon Thin Films," *Thin Solid Films*, vol. 182 (1989), pp. 63–78.
Ivanovsky, G. et al., "Diamond–Like Carbon Films: Deposition Processes, Properties and Applications," *Proc. Electrochem. Soc.*, 91–8 (1991), pp. 645–652.
Clausing, R. et al., "Diamond and Diamond–like Films and Coatings", NATO ASI Series B (Physics), vol. 266, Plenum Press, New York 1991, pp. 427–437.
Nicollian, E. et al., "MOS (Metal Oxide Semiconductor) Physics and Technology", *John Wiley & Sons*, New York 1982, pp. 18–22.
Oh, J. et al., "InP MIS Structures with Diamondlike Amorphous Carbon Films Deposited by Ion–Beam Sputtering and From Plasma" *Solid–State Electronics*, vol. 29, No. 9 (1986), pp. 933–940.
Kapoor, V. et al., "Diamondlike carbon films on semiconductors for insulated-gate technology", *Journal of Vacuum Science & Technology*, vol. 4 (1986), pp. 1013–1017.

*Primary Examiner*—Olik Chaudhuri
*Assistant Examiner*—S. Mulpuri
*Attorney, Agent, or Firm*—Kenyon & Kenyon

[57] ABSTRACT

Amorphous, hydrogenated carbon (a-C:H) having a low interfacial state density is obtained when a-C:H layers that had been produced on a semiconductor substrate through plasma deposition are subjected to a hydrogen treatment at an increased pressure and increased temperature.

8 Claims, No Drawings

AMORPHOUS, HYDROGENATED CARBON AS AN INSULATOR IN DEVICE FABRICATION

BACKGROUND OF THE INVENTION

1. Field of the Invention

The invention relates to a method for preparing amorphous, hydrogenated carbon having a low interfacial state density, and to amorphous, hydrogenated carbon prepared according to this method, as well as to its application.

2. Description of Related Art

Layers of amorphous, hydrogenated carbon, in short a-C:H, can be produced according to a PECVD method ("Plasma Enhanced CVD") from a, for example, radio-frequency excited plasma (the transmitter being capacitively coupled). Generally, these types of layers have bulk-defect concentrations at the Fermi [characteristic energy] level of $10^{16}$ to $10^{20}$ cm$^{-3}$ (c.f.: "Thin Solid Films", vol. 182 (1989), pp. 63–78; "Proc. Electrochem. Soc. 91-8-Proc. Int. Symp. Diamond Mater., 2nd", 1991, pp. 645–652; R. E. Clausing et al. "Diamond and Diamond-like Films and Coatings", NATO ASI Series B (Physics), vol. 266, Plenum Press, New York 1991, pp. 427–437). Such defects can—as as in the case of amorphous silicon (a-Si)—be traced back to unpaired electrons, i.e., radicals, or to carbon or graphite clusters.

In the application of a-C:H in MISFETs, i.e., MIS field-effect transistors (c.f., for example, the European Unexamined Patent Application 0 472 055), it is the interfacial state densities, i.e., the traps (deathnium centers) for electric charges that play a decisive role above all else. High state densities give rise to varying, non-reproducible threshold voltages during the switching operations of such transistors. Moreover, interfacial states affect the amplification factor of components, because not every charge is compensated at the by an additional charge in the inversion layer. Rather, the interfacial states are partially recharged. Furthermore, high gate voltages are needed to modulate conductivity (c.f.: E. H. Nicollian, J. R. Brews "MOS (Metal Oxide Semiconductor) Physics and Technology", John Wiley & Sons, New York 1982, pp. 18–22).

a-C:H films that have been deposited in a conventional manner in accordance with different methods exhibit—on various substrates—interfacial state densities in the range of $>10^{11}$ to approx. $10^{14}$ cm$^{-2}$.eV$^{-1}$ (c.f.: "Solid-State Electron.", vol. 29 (1986), pp. 933–940; "J. Vac. Sci. Technol. A", vol. 4 (1986), pp. 1013–1017). Examples of this are:

InP (RF-plasma deposition): 1 to $8 \times 10^{12}$ or $10^{12}$ to $10^{13}$ cm$^{-2}$.eV$^{-1}$;
InP (ion-beam deposition): 3 to $5 \times 10^{12}$ cm$^{-2}$.eV$^{-1}$;
GaAs (ion-beam deposition): 1 to $20 \times 10^{13}$ cm$^{-2}$.eV$^{-1}$;
Si (ion-beam deposition): $5 \times 10^{11}$ cm$^{-2}$.eV$^{-1}$.

Our own tests, in which a deposition on to silicon was carried out by means of high-frequency-excited plasma, produced a value of 1 to $3 \times 10^{12}$ cm$^{-2}$.eV$^{-1}$.

However, interfacial state densities within these ranges are not adequate for functional gate insulations. Rather, a lower state density is required for this, i.e., a state density more or less within the range of $10^{10}$ through $10^{11}$ cm$^{-2}$.eV$^{-1}$. Up until now, however, such values have attainable with conventional methods.

SUMMARY OF THE INVENTION

The object of the invention is to provide a method that permits the manufacturing of a-C:H layers having an interfacial state density of $\leq 5 \times 10^{11}$ cm$^{-2}$.eV$^{-1}$.

This is achieved in accordance with the invention in that a-C:H layers produced on a semiconductor substrate through plasma deposition are subjected to a hydrogen treatment at an increased pressure and increased temperature.

DETAILED DESCRIPTION OF THE INVENTION

The hydrogen high-pressure treatment in accordance with the invention achieves a considerable reduction in the interfacial state density, in fact, by about the factor 10 through 30. Moreover, appropriate measurements demonstrate an increase in the specific electric resistance by about the factor 40. It is also significant that the layers exhibit adhesive strength after the hydrogen treatment as well.

In the case of the method according to the invention, a-C:H layers that have been applied to semiconductor substrates—in particular of silicon (Si), silicon carbide (SIC), gallium arsenide (GaAs) or indium phosphide (InP)—by means of plasma deposition are treated with hydrogen, for example, in an autoclave at an increased pressure and increased temperature. The pressure should be about 50 to 1500 bar, preferably up to about 1000 bar. The temperature generally lies between about 100° and 500° C.; preferably up to about 350° C. The hydrogen treatment takes several hours, generally about 1 to 10 h.

During the high-pressure treatment, an inert gas can be advantageously added to the hydrogen. Preferably, a noble gas, in particular argon or helium, is used for this purpose. The concentration of inert gas generally amounts to about 1 to 50% by volume.

Amorphous, hydrogenated carbon that has been produced in accordance with the method of the invention exhibits an interfacial state density of $\leq 5 \times 10^{11}$ cm$^{-2}$.eV$^{-1}$. This type of carbon is very well suited as a gate insulation in MIS field-effect transistors, particularly in the case of GaAs-MISFETs.

The invention shall be clarified in still greater detail by the following exemplified embodiment which should be regarded in an illustrative, rather than a restrictive sense.

EXAMPLE

A silicon wafer of the p-type (resistance: 60 Ω g cm) is coated with a-C:H (film thickness 0.45 µm), after a pretreatment (sputtering in argon for 2 minutes given a self-bias voltage of −800 V), in an RF-excited (RF = radio frequency, i.e., 0.1 to 100 MHz), capacitively coupled CH$_4$-plasma (c.f., for example, the German Unexamined Patent Application 37 25 700 or U.S. Pat. No. 5,055,421) at a pressure of 1 mbar and a self-bias voltage of −420 V. An interfacial state density of between 10 and $30 \times 10^{11}$ cm$^{-2}$.eV$^{-1}$ is determined on the thereby obtained a-C:H (optical energy [band] gap: 1.06 eV) (evaluation according to E. H. Nicollian et al., loc. cit., pp. 325–328).

The Si-substrate coated in such a way with a-C:H is pressurized—in a corresponding quartz holder—with a pressure of about 200 bar in an autoclave with hydrogen and retained for the duration of 8 hours at a temperature of about 275° C. (internal pressure: about 300 bar). After the hydrogen treatment, the interfacial state density is determined to be 1 to $3 \times 10^{11}$ cm$^{-2}$.eV$^{-1}$, i.e., it has diminished considerably. It is determined by means of the RBS-method (RBS=Rutherford Backscattering Spectrometry) that the hydrogen/carbon ratio has simultaneously increased from 0.36 to 0.44, i.e., hydrogen is inserted into the a-C:H, during the H$_2$ high-pressure treatment.

What is claimed is:

1. A method for preparing amorphous, hydrogenated carbon (a-C:H) having a low interfacial state density, comprising the steps of producing an a-C:H layer on a semiconductor substrate through plasma deposition, and treating the a-C:H layer with hydrogen at a pressure of 50 to 1500 bar and a temperature of 100° to 500° C.

2. The method according to claim 1 wherein an inert gas is added to the hydrogen.

3. The method according to claim 2 wherein the inert gas is a noble gas.

4. The method according to claim 3 wherein the noble gas is argon or helium.

5. The method according to claim 2 wherein the concentration of inert gas amounts to 1 to 50% by volume.

6. The method according to claim 1 wherein the hydrogen treatment is carried out within a time period of several hours.

7. The method according to claim 1 wherein the semiconductor substrate is silicon, silicon carbide, gallium arsenide or indium phosphide.

8. A method for reducing the interfacial state density of an amorphous, hydrogenated carbon layer, comprising the step of treating the layer with hydrogen at a pressure of at least 50 bar and a temperature of at least 100° C. for a period of time which is sufficient to reduce the interfacial state density of the layer.

* * * * *